United States Patent
Haider et al.

(10) Patent No.: US 10,184,998 B2
(45) Date of Patent: Jan. 22, 2019

(54) METHOD FOR POSITIONING AT LEAST ONE LOCAL COIL FOR RECORDING MAGNETIC RESONANCE DATA WITH A MAGNETIC RESONANCE DEVICE AND MAGNETIC RESONANCE SYSTEM

(71) Applicant: SIEMENS AKTIENGESELLSCHAFT, München (DE)

(72) Inventors: Sultan Haider, Erlangen (DE); Stefan Popescu, Erlangen (DE)

(73) Assignee: Siemens Aktiengesellschaft (DE)

( * ) Notice: Subject to any disclaimer, the term of this patent is extended or adjusted under 35 U.S.C. 154(b) by 791 days.

(21) Appl. No.: 14/679,044

(22) Filed: Apr. 6, 2015

(65) Prior Publication Data
US 2015/0293188 A1    Oct. 15, 2015

(30) Foreign Application Priority Data
Apr. 11, 2014    (DE) .................. 10 2014 207 020

(51) Int. Cl.
G01R 33/34      (2006.01)
G01R 33/3415   (2006.01)

(52) U.S. Cl.
CPC . G01R 33/34007 (2013.01); G01R 33/34084 (2013.01); *G01R 33/3415* (2013.01)

(58) Field of Classification Search
CPC ........ G01R 33/34007; G01R 33/34084; G01R 33/3415
USPC ......................................... 324/307, 309, 318
See application file for complete search history.

(56) References Cited

U.S. PATENT DOCUMENTS

| 2006/0106302 | A1* | 5/2006 | Takamori | ............... G01R 33/28 600/415 |
| 2006/0152220 | A1* | 7/2006 | Nabetani | ............ G01R 33/3415 324/309 |
| 2008/0108892 | A1  | 5/2008 | Ritter |  |
| 2008/0129293 | A1* | 6/2008 | Schnell | ............... A61B 5/0555 324/318 |

(Continued)

FOREIGN PATENT DOCUMENTS

| DE | 102006052711 A1 | 5/2008 |
| DE | 102009043446 A1 | 4/2011 |

(Continued)

OTHER PUBLICATIONS

Machine translation for DE102012206920.*
Machine translation for DE102012206921.*
Machine translation for DE102012206922.*

*Primary Examiner* — Amy He
(74) *Attorney, Agent, or Firm* — Schmeiser, Olsen & Watts, LLP

(57) ABSTRACT

A method for positioning at least one local coil for recording magnetic resonance data with a magnetic resonance device, wherein at least one surface data record, which describes the surface of the patient to be recorded who is already positioned for recording on a patient couch of the magnetic resonance device, is measured, the surface characteristic of the patient is extracted from the surface data record and at least one position and/or shape of at least one of the at least one local coil is chosen as a function of the surface characteristic in such a way that there is a pre-determined distance between the surface of the patient and the surface of the local coil is provided.

19 Claims, 8 Drawing Sheets

(56) References Cited

U.S. PATENT DOCUMENTS

| | | | |
|---|---|---|---|
| 2010/0189328 A1* | 7/2010 | Boernert | G01R 33/56375 382/131 |
| 2011/0074420 A1 | 3/2011 | Ladebeck | |
| 2013/0008726 A1* | 1/2013 | Eberler | A61B 5/0555 177/1 |
| 2014/0073904 A1 | 3/2014 | Biber | |

FOREIGN PATENT DOCUMENTS

| | | |
|---|---|---|
| DE | 102012206920 A1 | 10/2013 |
| DE | 102012206921 B3 | 10/2013 |
| DE | 102012206922 A1 | 10/2013 |
| DE | 102012216327 A1 | 3/2014 |

\* cited by examiner

METHOD FOR POSITIONING AT LEAST ONE LOCAL COIL FOR RECORDING MAGNETIC RESONANCE DATA WITH A MAGNETIC RESONANCE DEVICE AND MAGNETIC RESONANCE SYSTEM

CROSS-REFERENCE TO RELATED APPLICATIONS

This application claims priority to DE 102014207020.1 having a filing date of Apr. 11, 2014, the entire contents of which are hereby incorporated by reference.

FIELD OF TECHNOLOGY

The following relates to a method for positioning at least one local coil for recording magnetic resonance data with a magnetic resonance device, and to a magnetic resonance system.

BACKGROUND

Local coils are currently often used in modern magnetic resonance systems/magnetic resonance devices. Local coils have the advantage that they can be arranged closer to the target area to be recorded and therefore provide an improved signal-to-noise ratio (SNR). Furthermore, parallel imaging techniques can be employed by using a plurality of receiving coil elements.

The handling of the local coils itself is a time-consuming step in the workflow of a magnetic resonance examination in the field of use of local coils. Local coils to be used must firstly be selected by an operator, then be correctly arranged on the patient and be connected to a terminal, which is usually provided in the patient couch. This is complex in particular if it is taken into account that different local coils, which are adapted in terms of construction to the respective purpose, are used for different examinations and for different regions of the body to be examined.

A further problem in modern magnetic resonance devices is patient comfort. Due to the confined spaces patients who in particular are assessed as being claustrophobic, exhibit fear reactions and by way of example movements and the like which can lead to a poor image quality and to a termination of the examination. Local coils that have to be arranged close to the patient can intensify this problem still further since a patient can feel constricted by the close-fitting local coils.

A further problem in connection with the local coils is that slight damage can occur as a result of their manual positioning and manual conveying, by way of example if the local coils fall out of an operator's hand. Without local coils specifically matched to the magnetic resonance device problems may also occur if local coils become jammed between the patient and the patient-receiving device. Finally, the local coils that are not going to be used and are to be positioned at a distance from the magnetic resonance device require a certain amount of storage space. If this is to be provided in the magnetic resonance space itself, then an appropriate design thereof should be provided.

Finally, there is also the problem in relation to local coils of the sterility requirements in image-guided interventions which can limit the use of magnetic resonance systems for processes of this kind, or at least render them very time-consuming. The local coils also limit access to the patient which is often necessary for carrying out interventions.

Methods have already been proposed in for solving these problems. A receiving coil system is therefore known by way of example from DE 10 2012 206 920 A1 in which a holding device for positioning the receiving coils is used, wherein the holding device is positioned on a patient table and wherein the receiving coils are pivotably secured to the patient table. With the aid of the holding device the local coils can be adjusted to the respective patient, i.e. the dimensions of the body of the patient, and the respective examination, in particular the region of the body to be examined. It is possible to position the receiving coils in such a way that the patient feels less constricted, in particular the local coils can be arranged at a distance from the patient therefore, so while there may be losses in the quality of the generated image data and/or an extension to the length of the examination, anxiety attacks in the patient may be avoided. Securing the local coils to the receiving table also has the advantage that they cannot slide out of the operator's hand and fall to the floor. Specifically, a multi-stage adjusting mechanism is also proposed there with which the receiving coils (local coils) are shifted from a park position into a pivoting position, then turned by a pivoting movement about a first pivot axis and oriented toward a patient positioned on the patient table. The local coils disclosed therein can preferably be adjusted to the surface shape of the region of the body of the patient. This adjustment can be automated, for which purpose the local coils can comprise distance sensors with the aid of which the distance between the receiving coil and the patient may be metrologically detected. The local coil can then be automatically and preferably completely automatically oriented relative to the body of the patient on the basis of predefined distance parameters. A value or a value range can be specified for the signal-to-noise ratio as the desired value for an automated adjustment, with a value between 20 and 30 having been proven to be advantageous.

DE 10 2012 206 921 B3 discloses a similar concept, according to which a holding device for adjustable positioning of the receiving coils is likewise provided which comprises at least one rail which is positioned on a patient table and along which the receiving coils can be pushed. Also disclosed therein is that the receiving coil can be adjusted to the surface shape of the region of the body of the patient, with an automated adjustment, as already described, being possible.

DE 10 2012 206 922 A1 relates to a receiving coil system in which the holding device comprises a bracket which is secured to a patient table and allows adjustable positioning of the receiving coils.

None of these known solutions offers a complete solution to the problems mentioned in the introduction. In particular the use of the distance sensors in the automatic shape adjustment of local coils should be regarded as disadvantageous since this requires additional signal detection and forwarding inside the magnetic resonance device, and this can only be achieved in a manner compatible with magnetic resonance with great effort and therefore harbors the risk that the magnetic resonance measurement as such will be disrupted.

Embodiments of the invention is therefore based on the object of disclosing a positioning and shaping method for local coils, which is improved compared with the above methods and in particular manages without the use of distance sensors.

SUMMARY

An aspect relates to a method of the type mentioned in the introduction that at least one surface data record, which describes the surface of the patient to be recorded who is already positioned for recording on a patient couch of the magnetic resonance device, is measured, the surface characteristic of the patient is extracted from the surface data record and at least one position and/or shape of at least one of the at least one local coil is chosen as a function of the surface characteristic in such a way that there is a predetermined distance between the surface of the patient and the surface of the local coil.

It is particularly advantageous in this connection if the position and/or shape of the local coils can then also be adjusted at least automatically according to the chosen specifications, and this will be discussed in more detail below. The aspect is therefore proposing to enable automatic positioning and shaping on the basis of a surface characteristic extracted from a surface data record. If the surface characteristic has already been detected before the arrangement of the local coils therefore, the use of distance sensors inside the local coils themselves is no longer imperative. The workflow during a magnetic resonance examination is simplified significantly therefore and errors may be largely avoided.

Various possibilities for ascertaining the surface data record are conceivable within the scope of embodiments of the present invention. Therefore in a first embodiment of the present invention it may be provided that the surface data record is recorded with the magnetic resonance device, in particular as a localizer and/or scout scan. In this case the magnetic resonance device itself is therefore used to obtain the desired information about the surface characteristic. It is usually also possible to segment the patient him/herself as the object without problems on overview images that can be recorded quickly, by way of example from localizer measurements and/or scout measurements, and to differentiate him/her from the surroundings. A magnetic resonance data record of a localizer and/or scout scan may also be used as a surface data record therefore.

Alternatively, or when recording a plurality of surface data records for broadening the database, it may also be provided that the surface data record is recorded with an optical 3D-camera arrangement arranged for detection of the patient, having at least one camera and/or a laser measuring device. Camera systems, from which three-dimensional information can also be derived, which can therefore be used within the scope of embodiments of the present invention, are basically already known. Stereo cameras by way of example can be used, but it is also possible to use 3D cameras directly as part of the camera arrangement, by way of example what are known as Time-of-Flight cameras (TOF cameras). Systems are also known which are fitted with a laser measuring device. It is known in this connection to project by way of example a laser grid onto the patient, specifically his/her surface therefore, and this is then detected in the images of the cameras and is analyzed by an image processing unit in order to extract the surface data record therefrom. If this kind of illumination of the patient is employed it may be expedient to scan only a region of interest that contains the target area since no local coils are required in the remaining region of the surface of the patient, and no surface information is required there either therefore. The planned imaging task, which can also describe the target area, can be provided by a controller of the magnetic resonance device to allow automatic operation of the laser measuring device; it is also conceivable, however, to manually adjust the laser measuring device or at least the illuminated region.

The use of a 3D camera system can also have further advantages, so in a specific development of the inventive method it may be provided that the image data of the camera arrangement is evaluated for detection of movements of the patient. It is therefore conceivable for the camera arrangement to also observe patient movements and supply feedback in this respect which can preferably be automatically processed further. Specifically it may be provided that movement data describing movements of the patient during repositioning and/or reshaping of local coils and/or for movement correction is evaluated in recorded magnetic resonance data. It is absolutely conceivable for the patient arranged in the patient-receiving device to also be detected by at least some of the cameras in the camera arrangement to enable movement detection. If, by way of example, the patient threatens to collide with remote local coils, as a result of a movement, this may be detected within the context of real-time monitoring using the movement data, and repositioning and/or reshaping of the local coils can occur. The movement data can also be entered in movement correction algorithms that are basically known.

It should be noted at this point that other sources are of course also basically conceivable for the surface data record, by way of example, contact-less scanning devices specifically provided for this purpose, for example terahertz sensors and the like. In any case the surface set should, however, be registered in a certain way with the magnetic resonance device since this ultimately provides the fastening point for the local coils to be positioned and shaped. If the magnetic resonance device itself is not used for recording the surface data record therefore, the coordinate systems of the source for the surface data record, by way of example the camera arrangement therefore, and the magnetic resonance device can be joined by a calibration process. Appropriate calibration data can be stored in a controller of the magnetic resonance device which can then also receive data from the surface data record. Since the patient couch can conventionally be moved automatically anyway, its position inside the magnetic resonance device is usually also known to a controller, so movements in relation thereto can be included.

The surface characteristic, provided it does not emerge directly from the surface data record, can be derived from the surface data record with the aid of various processing algorithms. The surface characteristic can expediently be ascertained in a model, with polygon models or the like in particular lending themselves to this. These allow a sufficiently accurate reproduction of the actual surface characteristic in order to determine the position and/or shaping of coils to be used.

A particularly advantageous development of embodiments of the present invention provides that at least one suitable local coil is chosen as a function of the surface characteristic. The surface characteristic can therefore also be evaluated as regards which local coils are particularly suitable, or are even suitable at all, for the forthcoming imaging task since in their basic shape they already match a corresponding shape of the patient and/or are of a sufficient size by way of example. It is also conceivable by way of example to determine the type and/or the size of the local coils to be used more accurately using the surface characteristic.

In this connection it is also particularly expedient if the choice of at least one local coil is made as a function of a target area of the patient to be recorded. The pending imaging task is therefore also included in the automatic choice of local coils, preferably in addition to consideration of the surface characteristic. A head local coil is particularly expedient if, by way of example, magnetic resonance recordings are to be effected on the head of a patient. Certain local coils are better suited than other local coils for other areas of the patient as well, by way of example the abdomen or extremities. Information about the target area to be recorded can already be stored in a controller of the magnetic resonance device, and this then also takes on the automatic selection of suitable local coils. Such a design of the method is particularly expedient if a storage space and/or a storage device exists from which the local coils can automatically be conveyed to the magnetic resonance device, in particular the patient couch, for which purpose a suitable conveying mechanism may be used. Automatic supply of exactly the suitable local coils can then be achieved in order to accelerate and simplify the workflow further.

In a particularly advantageous development of embodiments of the present invention it is provided that the positioning and/or adjustment of the shape of the at least one local coil occurs at least partially automatically by way of at least one movement device. It is of course particularly expedient if the magnetic resonance system is configured in such a way that the local coils are integrated in such a way that any positioning and shaping can proceed completely automatically. It is then conceivable to ascertain the surface data record completely automatically and automatically evaluate it in relation to a surface characteristic, to determine completely automatically herefrom conclusions about the optimum position and/or shape of the local coils to be used, in particular also automatically chosen local coils, and to then also bring these local coils automatically into the ascertained position and/or shape. However, it is particularly preferably at least possible to produce the shape of the local coil, automatically ascertained from the surface characteristic, via the movement device.

It should also be mentioned at this point that the local coils, at least in the state in which they are automatically moved and/or shaped, are permanently secured in a defined manner to the magnetic resonance device, in particular to the patient couch and/or inside the patient-receiving device. The position and/or shape of the local coils ascertained as being ideal with respect to the surface characteristic may therefore be transferred without problems to a corresponding coordinate system of the magnetic resonance device, and therefore the local coils, where the movement devices can operate with respect to a different coordinate system.

It may be provided in one embodiment of the invention that at least one local coil is used with a movement device having chambers that can be pneumatically and/or hydraulically filled or emptied for shaping. These kinds of embodiments of local coils are basically already known and can contain chambers by way of example which can be filled with a fluid and which, depending on their filling state, lead to different shapings of the local coil. Cushion-like structures are conceivable by way of example. One advantage of such an embodiment is relatively simple potential shaping of the local coil, wherein the movement device that operates pneumatically and/or hydraulically can be created so as to be compatible with magnetic resonance. Other variants for the controlled shaping of local coils are of course also conceivable, by way of example by way of changes in temperature and/or robotic arms and/or holding mechanisms which can preferably be moved hydraulically and/or pneumatically.

Generally it is expedient if movement devices used are configured so as to be compatible with magnetic resonance. Generally, therefore, it may also be provided that a hydraulic and/or pneumatic movement device is used as at least one movement device for positioning at least one local coil. As already mentioned, robotic arms and/or other mechanisms that primarily operate pneumatically and/or hydraulically are conceivable, by way of example extendable holders and the like.

A particularly preferred embodiment of the present invention provides that at least one of the at least one local coils to be positioned and shaped inside the patient-receiving device of the magnetic resonance device is secured to at least one extendable holder, wherein the extendable length of the at least one extendable holder is chosen as a function of the positioning and/or shape determined for the local coil. Preferably all or at least most of the required local coils can be arranged inside the patient-receiving device (patient tunnel) in such a way that they can be moved by extendable holders, i.e. holders whose length can be changed, toward the patient and away from the patient. It is preferably then also provided with such telescopic connections or other extendable holders that these are operated hydraulically and/or pneumatically in order to produce the desired magnetic resonance compatibility. In this way a functionality comparable to that of a car wash is ultimately provided because the local coils can, if needed, be moved toward the patient in a specific position (and optionally also shape), if required, and can be removed again if the corresponding local coil is no longer required or if the patient leaves the patient-receiving device again. The local coils then expediently have a park position immediately adjacent to the edge of the patient-receiving device, in which position they are arranged at a maximum possible distance from the patient, so a type of storage position is also achieved therefore. If, by way of example, the patient-receiving device is covered as uniformly a possible by a large number of smaller local coils, only the local coils that are actually also required need to be moved toward the patient.

It should be noted at this point that shaping can also be achieved by way of extendable holders, in particular, by securing the corresponding local coil by way of at least two extendable holders, which can be adjusted independently of each other, to the patient-receiving device. The flexible local coils then adjust to the chosen extended lengths so a change in shape is given. Of course more than two extendable holders may also be used in this connection. Alternatively and/or additionally it is of course also possible to use other options for shaping the extendable and retractable local coils, by way of example the embodiment already mentioned with chambers that can be filled and/or emptied pneumatically and/or hydraulically.

In this particularly expedient embodiment a local coil arrangement with a high level of flexibly can be created around the target area of the patient to be recorded without the local coils touching the patient or constricting him/her too much. The local coils are in clearly defined positions. This means the coordinate system in which the movement devices of the local coils which actuate the extendable holder work, is inevitably registered with the coordinate system of the magnetic resonance device, so the results of the surface ascertainment and therefore the optimum positions and/or shapes of the local coils resulting therefrom may ultimately be implemented directly and completely automatically. Human intervention is no longer required in an embodiment of this kind. The patient is automatically measured, whether by a camera arrangement, the magnetic resonance device or some other means, a surface characteristic is automatically extracted, the position and/or shape of the required local coils, which are chosen with the aid of the imaging task or the target area, are adjusted completely automatically to the surface area and, as soon as the patient is in the patient-receiving device, the chosen, required local coils are automatically moved towards him/her and adjusted in terms of their shape.

The conveying of signals and/or power in relation to the local coils can also easily be achieved using such extendable holders by guiding cabling for the at least one local coil supported by an extendable holder through at least one of the at least one extendable holders. Of course other techniques for power supply and/or signal transmission are also conceivable, however, by way of example wireless techniques have already been proposed, which may also be used particularly advantageously in this exemplary embodiment.

In a further embodiment at least some of the local coils to be positioned and shaped can likewise be arranged inside the patient-receiving device of the magnetic resonance device. In an embodiment of this kind it is provided that at least one of the at least one local coils to be positioned and shaped is arranged inside the patient-receiving device of the magnetic resonance device and has two planar, flexible elements secured to opposing sides of the patient-receiving device and which can be displaced relative to each other in a shared guide, wherein the surface of the local coil dependent on the degree of overlapping, and therewith the position and/or shape of the local coil, is determined by the position of the elements relative to each other. Two elements of the same width can therefore overlap the patient by way of example and thereby form a kind of half cylinder. If the elements are pushed towards each other in the longitudinal direction, their overlap and therefore their surface changes, and therewith their position and shape. By increasing the overlap the local coil can therefore be moved to the desired proximity in relation to the patient, it being possible to also use further shaping movement devices to adjust the shape of the local coil even more precisely. In a storage position and shape the overlap can be minimal by way of example and the two elements can rest on the surface of the patient-receiving device. In this way it is therefore also possible to keep local coils inside the patient-receiving device, and these can be brought close to the patient if required.

It should also be noted at this point, however, that other embodiments are of course also conceivable in which at least some or even all local coils are not, or will not, be secured to the patient-receiving device, and instead are, or will be, secured to the patient couch. Embodiments have already been proposed by way of example therefore, cf. also the documents mentioned in the introduction, in which the local coils are stored to one side of the patient couch. The preparation time in the case of magnetic resonance examinations can also be significantly reduced hereby and there are no local coil cables since a direct connection can be established between the patient couch and the local coils. Embodiments have been proposed for example in which the local coils are extendably stored beneath the patient table. The embodiments mentioned in the introduction with the various holding mechanisms can also be used in embodiments of the present invention.

A fundamental feature of embodiments of the present invention is also that the position and/or shape of the local coils is/are chosen such that they do not touch the patient. As already illustrated, advantages in relation to sterility and/or in the case of claustrophobic patients can be achieved in this way. Specifically, it may be provided that the pre-determined distance is chosen in such a way that the signal-to-noise ratio remains above a threshold value and/or in a specific value interval. Calibration measurements by way of example can be carried out for this purpose. The potential distance from the surface of the patient is therefore chosen such that there is still a clinically acceptable signal-to-noise ratio, by way of example a signal-to-noise ratio in a range of 15 to 30, from which said threshold value can also be chosen. To be able to ascertain such permitted, tolerable distances between the patient and the local coils for a clinically acceptable image quality, calibration measurements by way of example can be carried out, in particular also using a phantom. Examinations in a 1.5 tesla magnetic resonance device have therefore shown that a clinically acceptable signal-to-noise ratio greater than 25 or for some local coils even greater than 30 can be achieved if a distance between the patient and the local coil is up to 5 cm.

Since the surface of the patient can be carried out in the inventive method without the use of the local coils themselves, as has already been illustrated, distance sensors may also be omitted from the local coils. Nevertheless it can be expedient if at least one of the at least one local coils has distance sensors for measuring the distance from the surface of the patient whose measured values are used for checking the plausibility of the position and/or shaping and/or for in particular automatic fine positioning and/or within the context of an emergency program for spacing the local coil from the patient in the case of contact with the patient. Distance sensors on the local coils can therefore be used by way of example to check the positioning and/or shaping of the local coils with respect to the patient which has been automatically brought about for example by movement devices. If a non-plausibility is found a corresponding output can be made, at an operator terminal by way of example. It is also possible, however, in particular if the position and/or shape of the local coils can be only roughly determined due to the surface characteristic, to make a fine adjustment, which preferably proceeds automatically, on the basis of the measured values of the distance sensors. If it is found by way of example that the distance from the patient still exceeds a permitted threshold value, a movement direction can be activated to bring the local coil to the patient and the like at least in this region closer. Finally, it is possible to use the distance sensors as collision sensors or even to replace them with collision sensors. Contact with the patient by the local coil can then be detected, so for example immediate emergency distancing of the local coil from the patient can be initiated by means of a movement device. This is particularly expedient if local coils which can be extended and retracted by extendable holders are used inside the patient-receiving device.

It should also be noted at this point that in terms of their other properties the known local coils can be adjusted as desired in order to satisfy the quality requirements. It can therefore be provided by way of example that the local coils comprise coil elements, formed from coil conductors, which are embedded in a (shapeable) tissue material. These coil elements can at least partially overlap to a certain degree in order to produce decoupling of the individual coils and/or an optimum signal-to-noise ratio.

Within the scope of embodiments of the present invention it is preferred, but not imperative, for it to be possible to bring the coils completely automatically from a storage position into the ascertained position and/or shape. In cases that differ from this manual cooperation of an operator is required, by way of example, to secure the local coils to the patient couch in a defined manner or to move them from a storage position. To simplify the process of the magnetic resonance examination it may then be provided that at least some of the local coils that are not required are stored on and/or in the patient couch and to the side. Compartments and/or drawers by way of example can be provided there for storing the local coils; it is also conceivable, however, to roll these and the like in the manner of a blind to the side of the patient couch.

If the local coils are stored remotely from the magnetic resonance device, a particularly expedient embodiment of the invention provides that a storage space arranged at a distance from the magnetic resonance device and/or a storage device for local coils that is arranged at a distance from the magnetic resonance device is used, from which the in particular automatically chosen local coil(s) that are to be positioned and/or shaped are automatically conveyed to the magnetic resonance device, in particular a patient couch of the magnetic resonance device, by means of a conveying mechanism. In this case an embodiment is therefore achieved in which the required and preferred local coils automatically chosen using the target area and surface characteristic can ultimately be moved close for an operator, so he/she can secure them without problems to the patient couch for example and in a correspondingly defined position. A wide variety of specific embodiments are conceivable in this connection, by way of example the use of robotic arms and the like, which are preferably actuated hydraulically and/or pneumatically.

It is particularly advantageous, however, if the conveying mechanism comprises a rail system along which the local coils are conveyed. A rail system of this kind can expediently also be used as the storage device itself, it then being possible by way of example for local coils suspended on the rail system to be moved from a park position, along a rail until they are close to the magnetic resonance device. At the magnetic resonance device the local coils can be removed from the rail by way of example and secured to the patient couch. After having been used they can simply be hung on the rail again, from where they are preferably automatically brought back into their park position.

However, it is also conceivable, in particular in combination with a previously described rail system, for the conveying mechanism to comprise an extendable arm, via which the local coils are conveyed directly to the patient couch, where they are manually and/or automatically connected. Conveyed local coils can be automatically removed from the rail system by way of example by the extendable arm and moved to the patient couch where they can then be received by an operator. However, it is also conceivable to at least partially automate the process of securing to the patient couch by way of suitable interfaces and connections to enable further simplification and acceleration of the workflow here.

A further advantageous development of embodiments of the present invention provides that at least local coils having a movement device for positioning the local coil are automatically removed from the patient on actuation of an operating element. If the patient feels constricted by way of example or if there is undesired contact with the patient by the local coils, an operating element, by way of example a button, can be provided for the patient, which, when actuated, completely automatically removes the automatically moveable or shapeable local coils from the patient. A further assurance can therefore be established for the patient, and this accommodates claustrophobic patients in particular.

In addition to the method, embodiments of the present invention also relates to a magnetic resonance system, comprising a magnetic resonance device and a local coil system having a controller designed for carrying out the inventive method. All statements relating to the inventive method may be transferred analogously to the inventive magnetic resonance system, with which said advantages may likewise be obtained therefore.

The magnetic resonance system can therefore detect a camera arrangement by way of example in order to record the surface data record. As has already been indicated, it is particularly preferred if a central controller, which is also responsible for operation of the magnetic resonance device, also assumes control of the local coil system, therefore the automatic determination of the surface characteristic, the choice of local coils using the surface characteristic and of the target area, the determination of suitable positions and/or shapes for the local coils to be used and ideally also their completely automatic positioning, in particular if they are provided inside the patient-receiving device, preferably arranged on extendable holders.

BRIEF DESCRIPTION

Some of the embodiments will be described in detail, with reference to the following figures, wherein like designations denote like members, wherein.

DETAILED DESCRIPTION

Figure 1:
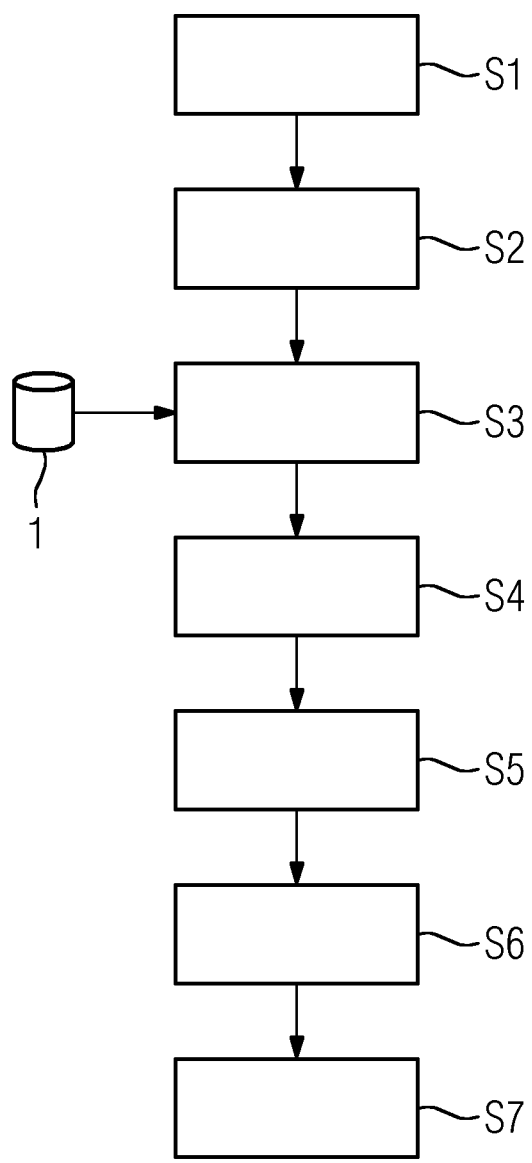
FIG. 1 shows a flowchart of an exemplary embodiment of the inventive method.

FIG. 1 shows a general flowchart of an exemplary embodiment of the inventive method.

The figure relates to the completely automatic adjustment of local coils in position and shape before a recording of magnetic resonance data with a magnetic resonance device. For this purpose, once the patient, who is to be examined, has already been positioned on the patient couch of the magnetic resonance device, a surface data record of the patient is recorded in step S1, which means the surface of the patient is measured. Different recording means can be used for this purpose, in particular the magnetic resonance device itself, in that firstly a localizer or scout scan of the patient is made from which his/her contour and therefore the surface of the patient can be derived. However, it is also conceivable to use a 3D camera arrangement by way of which the surface of the patient positioned on the patient couch can likewise be detected, in particular if the patient couch is still outside of the patient-receiving device of the magnetic resonance device. It is conceivable in this connection to directly use cameras with a 3D capability, by way of example Time-of-Flight cameras, or even a camera arrangement provided with a laser measuring device, in which a grid pattern is projected onto the patient and from the distortion of which a conclusion can be drawn about the surface structure of the patient. Finally, other scanning options are also conceivable, by way of example terahertz sensors.

In a step S2 a surface characteristic of the patient is extracted from the surface data record, at least in the target area, which is to be recorded by the subsequent magnetic resonance examination. The target area, and consequently an ROI for the surface characteristic, may be derived from examination data already present on a controller of the magnetic resonance device, which data has been input or transferred from another system, or optionally also be retrieved from an electronic patient file. In particular the surface characteristic can be determined more precisely in a model for the surface of a patient, and this can ultimately be as precise as desired. Typical examples are polygon models. However, it is also conceivable to approximate a patient from cylinders and/or ellipsoids if this is adequate for the respective application, even if this is less preferred.

In a step S3 first of all the local coils that are actually to be used for the subsequent magnetic resonance examination are chosen. In addition to the surface characteristic of the patient ascertained in step S2, examination data 1 is also included here, in particular again the target area to be recorded, wherein other examination data that describes the forthcoming examination may also be taken into account, however, if specific local coils are more suitable than others for the corresponding examination. In step S3 it is therefore possible, in particular if local coils that are stored externally anyway are used, to choose precisely those local coils that are already best adapted to the body shape of the patient. Local coils may be present by way of example in various sizes. Within the scope of embodiments of the present invention it is preferred, however, and this will be discussed in more detail below, if local coils already arranged in the patient-receiving device are used which can ultimately cover the patient-receiving device in certain segments and therefore also the patient moved into it. If the surface shape of the patient is now substantially known as well as which target area should be recorded, the corresponding segments, i.e. individual local coils, inside the patient-receiving device that are required to enable high-quality imaging of the target area can already be pre-selected.

Optimum positions and shapes of the local coils, which were chosen in step S3, are then determined in a step S4. It is essential in this connection that the positions and shapes of the local coils are chosen such that a specific distance from the surface of the patient, which is indeed known from the surface characteristic, is maintained. This means that it is also possible to maintain a certain distance in the case of claustrophobic patients in addition to satisfying sterility requirements. It is precisely in the case of local coils permanently provided inside the patient-receiving device that it is then expedient when there is no contact with the patient. The distance is chosen in such a way that a certain signal-to-noise ratio is maintained. A threshold value, which must still be maintained by the signal-to-noise ratio, between 20 and 30 can be chosen for example, from which, by way of example in calibration measurements, potential distances emerge. The local coil is positioned and shaped on the basis of its known movement and shaping capacities in such a way that these distances are preferably given and therefore outstandingly high-quality imaging continues to be enabled without the local coils having to be laid directly on the patient.

Once the positions and shapes have been determined for all of the local coils to be used these positions and shapes are advantageously completely automatically adjusted in step S5, and this is possible in particular if the local coils are arranged inside the patient-receiving device of the magnetic resonance device and can be moved there from a position adjacent to the edge of the patient-receiving device into an extended position close to the patient. This will be discussed in more detail below, in particular with regard to FIGS. 3 to 9. This means that, in the case of local coils of this kind that are arranged inside the patient-receiving device and can be automatically moved and shaped, firstly the patient is moved into the patient-receiving device and then the local coils are automatically brought into the pre-determined position and shape and the magnetic resonance data can be recorded.

In a further exemplary embodiment it may also be provided that local coils, which are yet to be connected and secured by staff to the patient couch, with the staff being informed about the securing site, are delivered via a conveying mechanism and are then attached to the patient couch accordingly. Automatic positioning and/or shaping then take (s) place.

Once the local coils have been correctly positioned, the actual imaging process can take place in step S6. If a camera arrangement has been used to determine the surface data record then this can be used not just during imaging but even before to monitor the movement of the patient by recording corresponding movement data of the patient. This movement data can be used to adjust the position and shape of the local coils and also to apply movement correction algorithms, which use this movement data, to recorded magnetic resonance data.

Once imaging has ended the local coils are automatically removed from the patient again, provided this is possible, in step S7. If the local coils are arranged inside the patient-receiving device anyway, they can be brought into their park position again adjacent to the boundary of the patient-receiving device, after which the patient can be moved out of the patient-receiving device. Otherwise the local coils, as is basically known, optionally already spaced apart, can be removed from the patient couch to which they are secured and optionally in turn be passed to the conveying mechanism which moves them into a storage position in a storage space and/or on a storage device.

Figure 2:
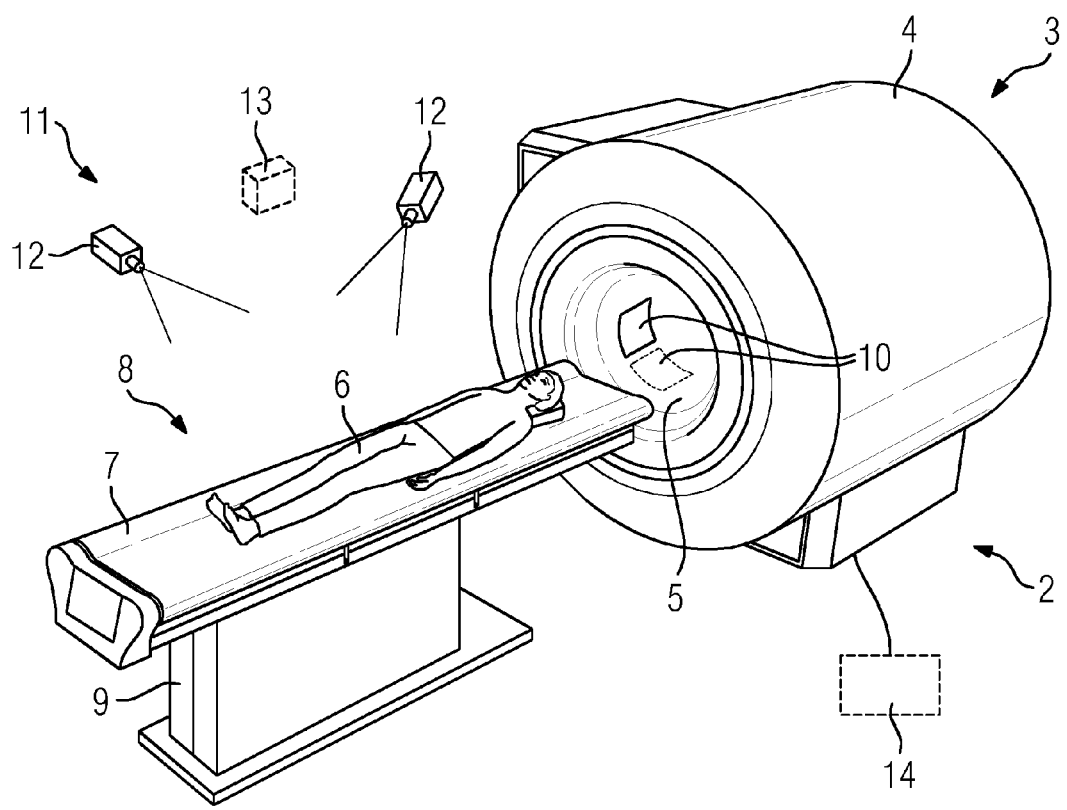
FIG. 2 shows an inventive magnetic resonance system.

FIG. 2 shows a perspective schematic diagram of an inventive magnetic resonance system 2 which as essential components comprises a magnetic resonance device 3 and a local coil system partially integrated in the magnetic resonance device 3. The magnetic resonance device 3, as is basically known, has a main magnetic unit 4 that defines a patient-receiving device 5 into which a patient 6 can be moved by means of a patient couch 7, which in the present case is part of a patient table 8, which also has an appropriate base 9.

In the present case the local coils 10, as is only indicated in FIG. 2, are arranged inside the patient-receiving device 5 and are shown in a park position adjacent to the boundary of the patient-receiving device 5.

Outside of the patient-receiving device 5 in the usually shielded magnetic resonance space there is provided moreover a camera arrangement 11 which in the present case has 3D cameras 12 that can scan the surface of the patient 6. A camera arrangement of this kind can optionally also have a laser measuring device 13.

Operation of the magnetic resonance system, i.e. both the magnetic resonance device 3 and the local coil system, is controlled by a controller 14 (only implied here) which is therefore designed to carry out the inventive method, in particular as has been illustrated in FIG. 1.

As mentioned, it is preferred here if the local coils 10 are arranged inside the patient-receiving device 5 of the magnetic resonance device 3 where they can be brought from a park position as close as possible to the edge of the patient-receiving device 5, into an extended position close to the patient 6.

Figure 3:
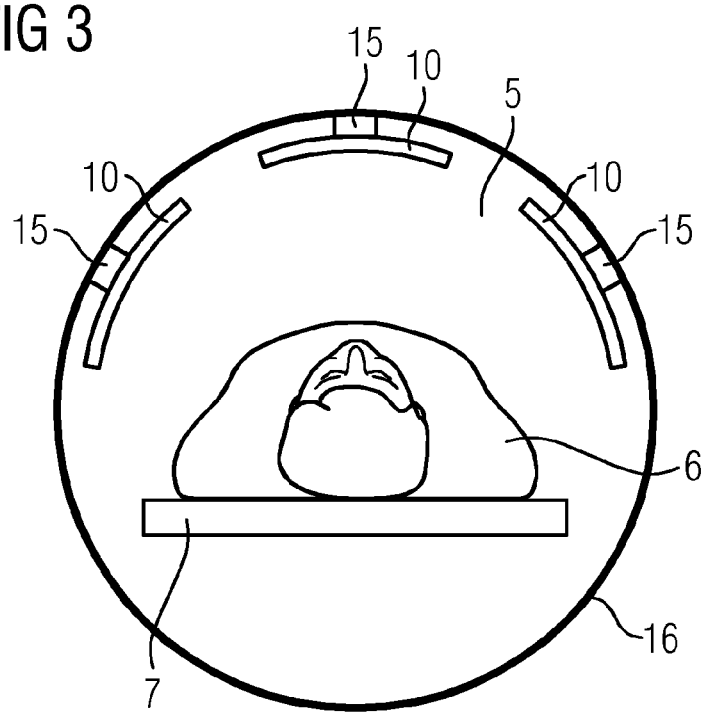
FIG. 3 shows a cross-section through a patient-receiving device having local coils, in a first exemplary embodiment with retracted local coils.
Figure 4:
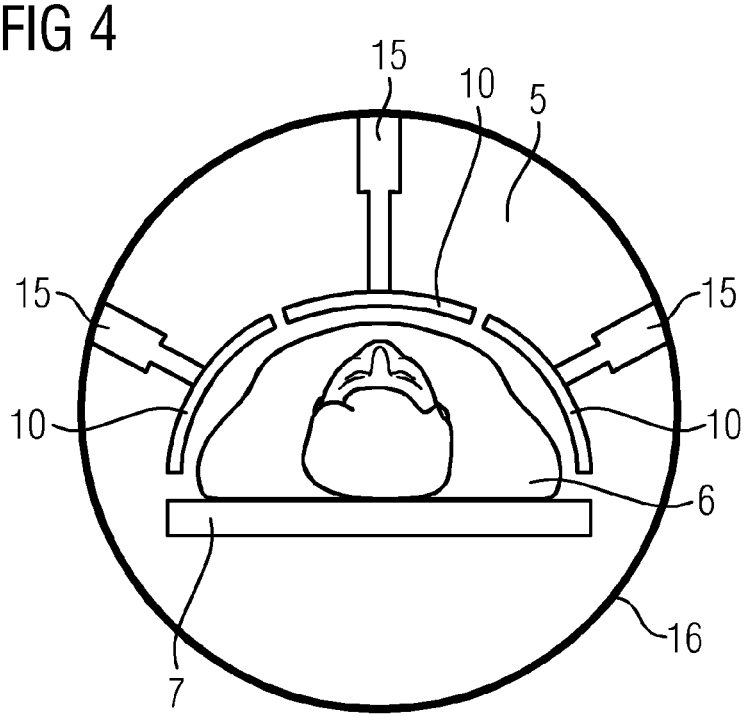
FIG. 4 shows a cross-section through the patient-receiving device according to FIG. 3 with extended local coils.

FIGS. 3 and 4 show a first exemplary embodiment for a specific embodiment of this kind. Shown there is a simplified sectional view through the patient-receiving device 5 into which the patient 6 on the examination couch 7 has already been moved. FIG. 3 shows the patient coils 10 supported by an extendable holder 15 in each case in a retracted park position in which they barely constrict the patient-receiving device 5 and are brought, moreover, into a shape that matches the boundary 16 of the patient-receiving device 5.

The extendable holders 15 are therefore part of movement devices, through which the local coils 10 can be brought into an extended position close to the patient, as is shown in FIG. 4. The extendable holders 15 operate pneumatically and/or hydraulically, so the movement directions are compatible with magnetic resonance. The local coils 10 are shaped in the present exemplary embodiment by a further movement device which can comprise for example chambers that can be filled with or emptied of a fluid which can bring about a specific shaping, as is shown by way of example in FIG. 4.

Of course not all local coils 10 have to always be extended, but only those that were chosen in step S3.

Figure 5:
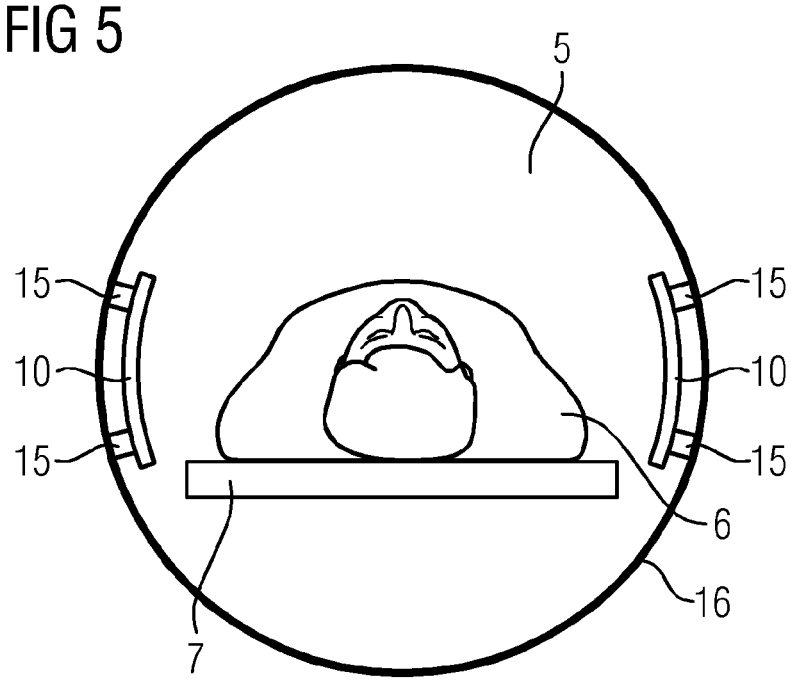
FIG. 5 shows a cross-section through a patient-receiving device according to a second exemplary embodiment with retracted local coils.
Figure 6:
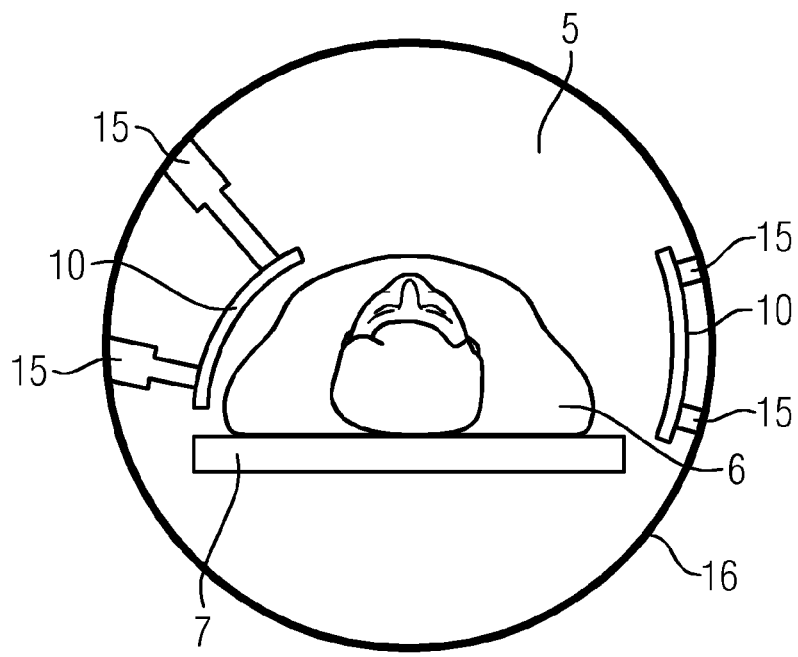
FIG. 6 shows a cross-section through the patient-receiving device according to FIG. 5 with an extended local coil.

FIG. 5 and FIG. 6 show an embodiment that has been modified with respect thereto, in which shaping of the local coils 10 may be achieved by way of the extendable holder 15, in that each of the flexible local coils 10 is supported by more than one extendable holder 15. FIG. 5 shows the local coils 10 in a park position again; in FIG. 6 the left one of the local coils 10 is moved close to the patient and appropriately shaped by the various extendable lengths of the extendable holders 10, which may be implemented in particular as telescopic rods, in order to follow the body shape of the patient 6 that results from the surface characteristic.

Figure 7:
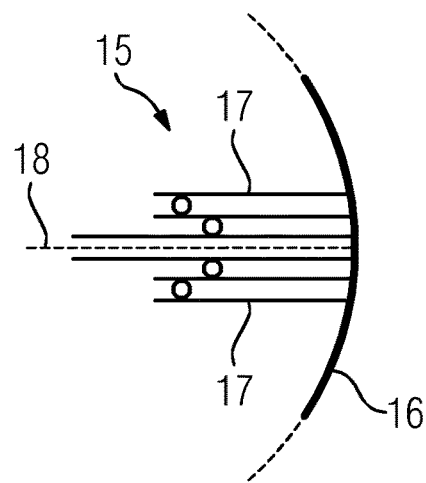
FIG. 7 shows an enlarged view of an extendable holder.

FIG. 7 shows one possible embodiment for an extendable holder 16 in more detail. As may be seen, this comprises a plurality of tubular parts 17 that are pushed one inside the other and can be moved with respect to each other to achieve the change in length. FIG. 7 also indicates cabling 18 which is led through the center of the extendable holder. This may contain pneumatic and/or hydraulic cables for a shaping movement device of the local coil 10 in addition to signal cables and/or power cables for the local coil 10 itself. It should also be noted that it may also be expedient if the local coils 10 are designed for wireless signal transmission and wireless receiving of power, as has been stated elsewhere, so the cabling 18 can optionally also comprise just hydraulic and/or pneumatic cables for a movement device for shaping.

Figure 8:
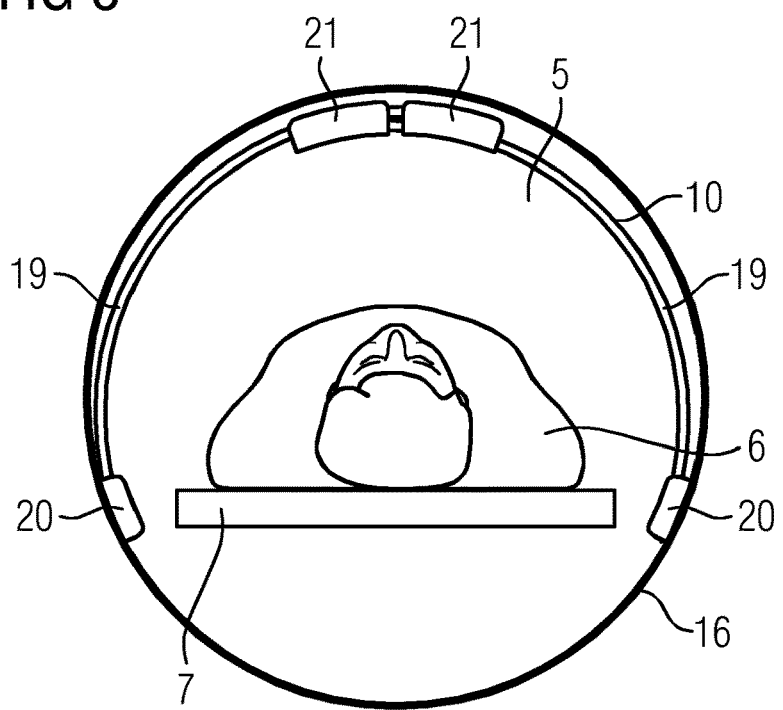
FIG. 8 shows a cross-section through a patient-receiving device according to a third exemplary embodiment with local coils spaced apart from the patient couch.

FIG. 8 shows a further possible embodiment of a local coil 10 arranged inside the patient-receiving device 5. The local coil 10 shown there comprises two elements 19 which are each secured to opposing sides of the patient-receiving device 5 by securing mechanisms 20. Each of the elements 19 is led through a guide device 21 that simultaneously serves to hold the free end of the other element 19. The elements 19 are flexible and can be pushed relative to each other by means of the guide devices 21. This means that if one of the guide devices 21 is moved by the other parts (not shown here) of the movement device, the effective surface of the local coil 10 and therefore the available diameter on one side changes, over which diameter it can extend, resulting in a change in position and shape.

Figure 9:
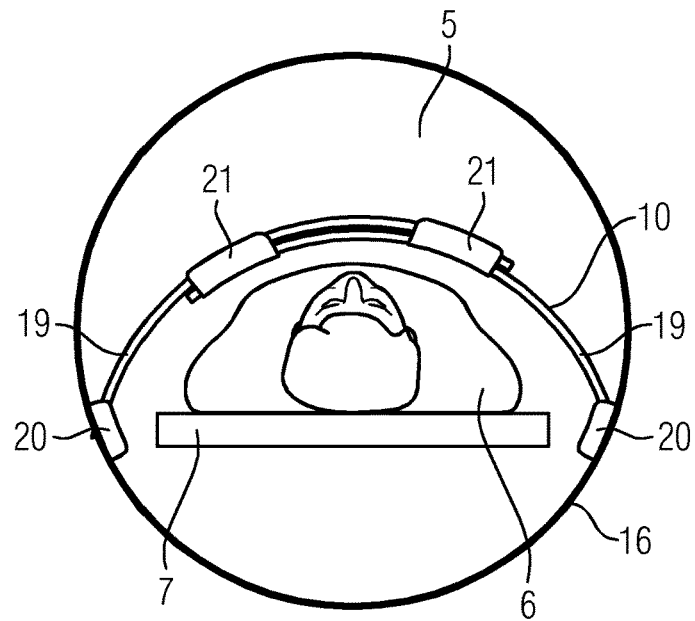
FIG. 9 shows a cross-section through the patient-receiving device according to FIG. 8 with a local coil moved close to a patient.

FIG. 9 shows the local coil 10 in a second state in which the guide devices 21 have been moved almost completely up to the stop, so the elements 19 overlap in a large area and in terms of shape and position the local coil 10 rests closely on the body of the patient 6 at the desired determined distance. Of course further shapes and positions are also conceivable in other positions of the guide devices 21, and these are then specifically adjusted to the measured surface characteristic of the patient again.

The movement devices are also implemented hydraulically and/or pneumatically in the third exemplary embodiment according to FIGS. 8 and 9.

Figure 10:
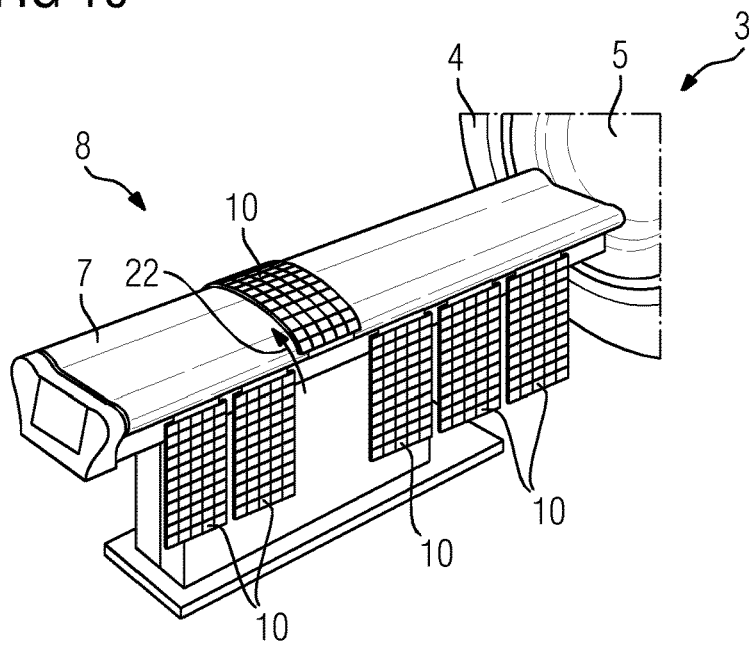
FIG. 10 shows a perspective view of a patient couch.

FIG. 10 shows one possibility for storing local coils 10 on the examination couch 7. There the local coils 10 are available by way of a hinge in a park position to the side of the examination couch 7 and can be manually or automatically folded upwards in the direction of the arrow 22 over a patient lying on the examination couch 7, it also being possible to determine the distance from the surface of the patient by way of the shaping.

Figure 11:
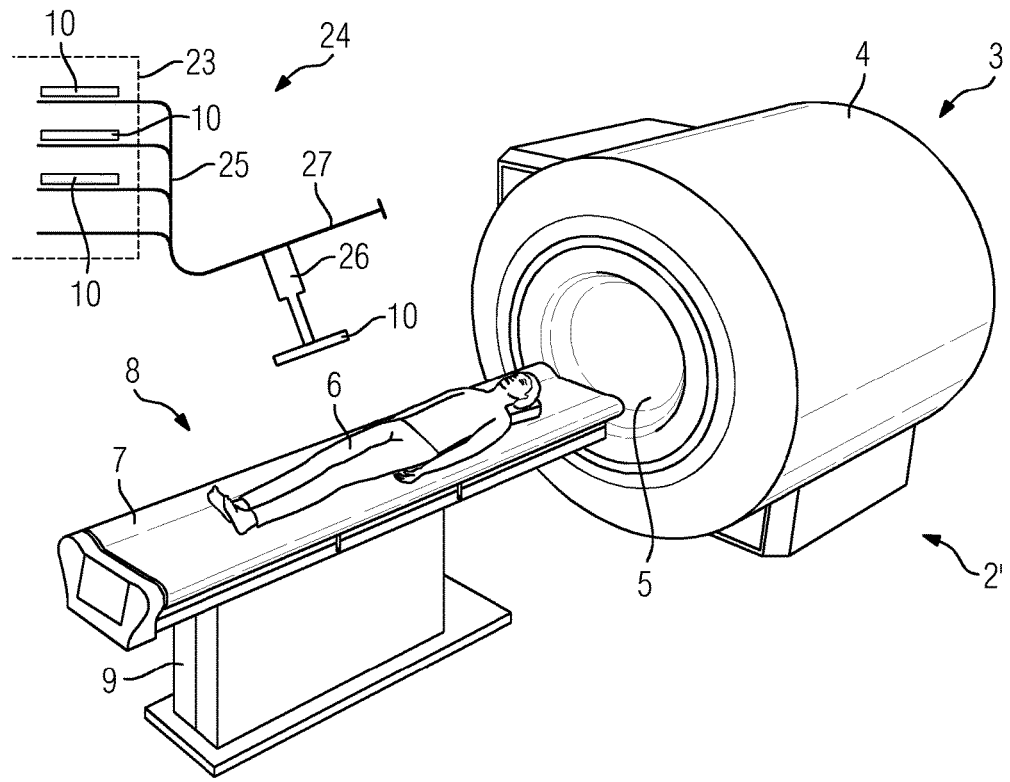
FIG. 11 shows an inventive magnetic resonance system.

FIG. 11 shows a further exemplary embodiment of an inventive magnetic resonance system 2', again with a corresponding magnetic resonance device 3, with the same elements again being identified by the same reference numerals for the sake of simplicity.

In this case there are no local coils 10 provided inside the patient-receiving device 5 and instead the local coils 10 are stored in a storage space 23, arranged at a distance from the magnetic resonance device 3, and can be conveyed by means of a conveying mechanism 24, comprising a rail system 25 in the present case, to the magnetic resonance device 3. In the present case the rail system 25 is also used as a storage device since it divides in the storage space 23 and therefore has storage positions for the local coils 10.

In the state shown in FIG. 11 one of the local coils 10 has already been conveyed via the rail system 25 to the magnetic resonance device 3 where an extendable arm 26 of the conveying mechanism 24 has removed the local coil 10 from the rail 27 there of the rail system 25 and moved it close to the examination couch 7 where an operator merely has to remove the local coil 10 and secure it to the examination couch 7 where the at least partially automatic positioning and shaping of the local coil 10 can then take place. An automatic connection is optionally also conceivable, in particular if the telescopic arm is designed as a robotic arm and/or comprises such an arm.

It should also be noted at this point that the exemplary embodiments and embodiments shown here may also be combined. It is therefore quite conceivable to provide some of the local coils 10 inside the patient-receiving device 5, to store some others to the side of the examination couch 7 and still more in a storage space 23 so they may be delivered by a conveying mechanism 24.

Figure 12:
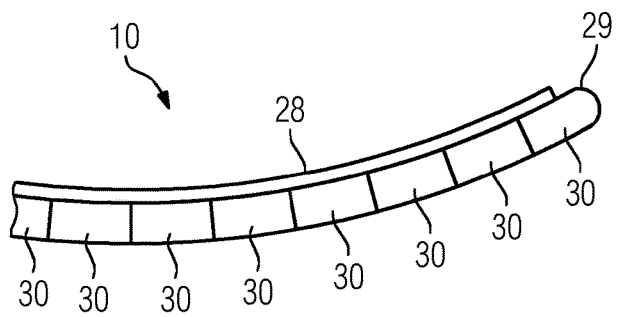
FIG. 12 shows an embodiment of a shapeable local coil.

FIG. 12 shows in the form of a schematic diagram one possibility for automatic shaping of a local coil 10. In the example illustrated there this has a flexible printed circuit board element 28 on which the coil elements, which can partially overlap for decoupling and/or increasing the signal-to-noise-ratio, are implemented. The flexible printed circuit board 28 is supported by a likewise flexible support 29 which is divided into a plurality of chambers 30. The chambers 30 can each be filled to a specific level with a fluid and/or be emptied of the fluid. This results in different shapes of the support 29 and therefore the local coil 10.

Figure 13:
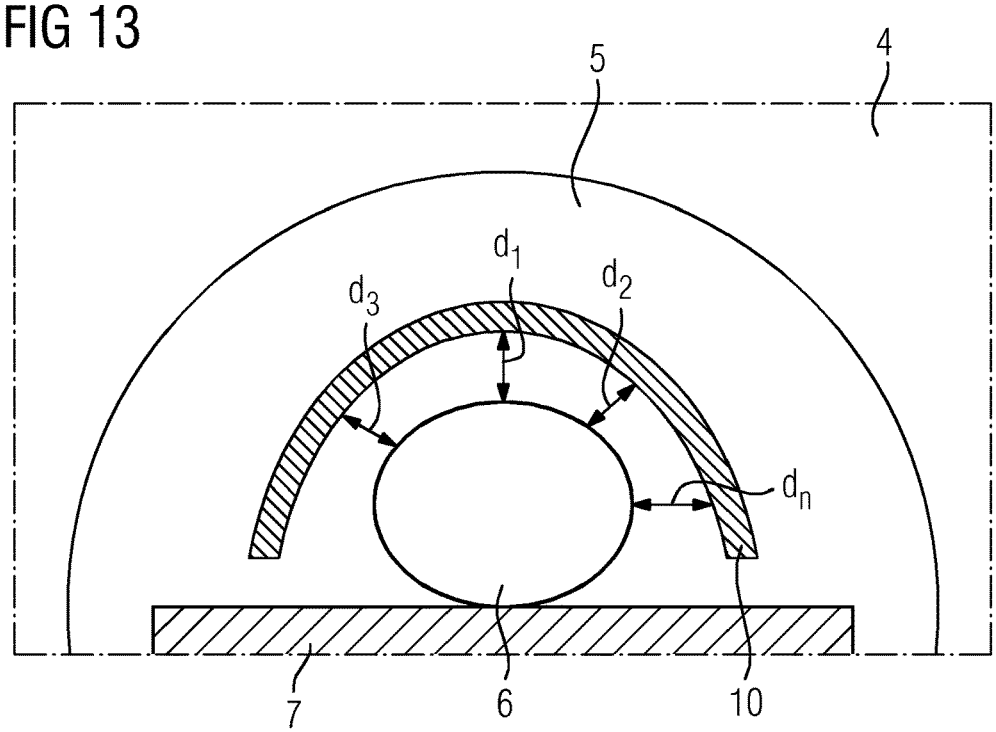
FIG. 13 shows a drawing for spacing a local coil from a patient.

FIG. 13 shows, again in the form of a schematic diagram, the shaping of the local coil 10 in such a way that a specific distance is maintained from the surface of the patient 6. It is basically also conceivable that, if different suitable distances d have been found, as a function of the target area, then these may also be stored accordingly in the controller 14 and taken into account.

Figure 14:
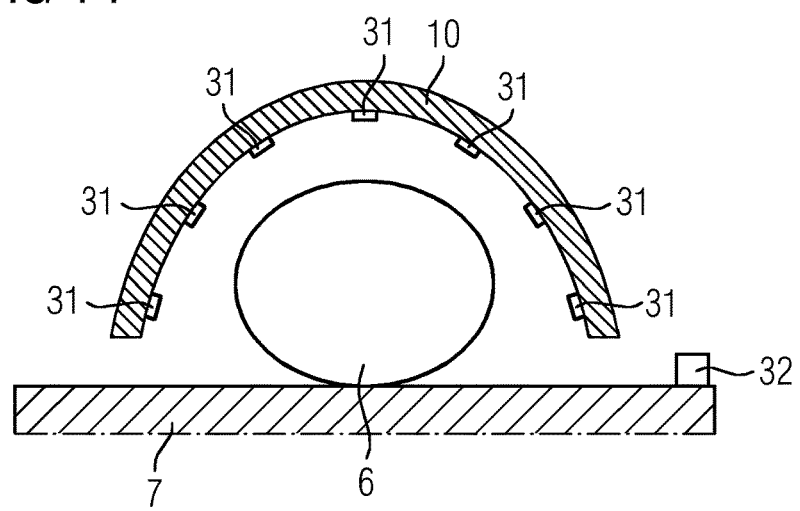
FIG. 14 shows a further drawing of a local coil with distance sensors.

FIG. 14 shows an embodiment of a local coil 10 having distance sensors 31. The measured values of the distance sensors 31 can be used for checking the plausibility of the adjusted position and/or shape, in particular therefore the desired distances d, with a fine adjustment using the measured values of the distance sensors 31 also being possible, however. The measured values of the distance sensors 31 may also be evaluated in such a way that in the event of the patient 6 being approached too closely, in particular in the event of contact with the patient 6, an emergency program is triggered which automatically removes the local coils 10 from patient 6.

In this connection reference should also be made to the fact that an emergency control element 32 that can be reached by the patient can be provided on the examination couch 7, and this can be actuated by the patient 6 to automatically remove the local coils 10, by way of example, if he is feeling too constricted by them. Of course for a construction of this kind it is also optimal if the local coils 10 are provided inside the patient-receiving device 5. Following actuation of the emergency control element 32 they can then be returned without problems into the park positions adjacent to the boundary 16 of the patient-receiving device 5.

Although FIG. 14 shows another variant of a local coil 10 with distance sensors these are basically no longer necessary due to the measurement of the surface shape of the patient 6 and can in particular be omitted if they would otherwise require electrical signal cables or the like which could interfere with the magnetic resonance imaging. However, instead of the distance sensors 31 it is conceivable to use pneumatic and/or hydraulic collision sensors which can therefore detect contact with the patient 6 and can also lead to an emergency return of the local coils 10.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A method for positioning at least one local coil for recording magnetic resonance data with a magnetic resonance device, comprising:
measuring at least one surface data record, which describes a surface of a patient to be recorded who is already positioned for recording on a patient couch of the magnetic resonance device; extracting the surface characteristic of the patient from the surface data record and choosing at least one of a position and a shape of at least one of the at least one local coil as a function of the surface characteristic in such a way that there is a pre-determined distance between the surface of the patient and the surface of the local coil, wherein the step of choosing the positioning and adjustment of the shape of the at least one local coil is made at least partially automatically by way of at least one movement device; and further comprising arranging at least one of the at least one local coils to be positioned and shaped inside the patient-receiving device of the magnetic resonance device and has two planar, flexible elements which are secured to opposing sides of the patient-receiving device and can be displaced relative to one another in a shared guide, wherein the surface, dependent on the degree of overlapping, of the local coil, and therewith the at least one of position and shape of the local coil, is determined by the position of the elements relative to each other.

2. The method as claimed in claim 1, wherein the step of measuring the surface data record is recorded with the magnetic resonance device, as one of a localizer and a scout scan.

3. The method as claimed in claim 1 wherein the step of measuring the surface data record is recorded with an optical 3D-camera arrangement arranged for detection of the patient, having at least one of a camera and a laser measuring device.

4. The method as claimed in claim 3, further comprising evaluating the image data of the camera arrangement for the detection of movements of the patient.

5. The method as claimed in claim 4, wherein the step of evaluating movement data which describes the movements of the patient in the case at least one of a repositioning, a reshaping of local coils and for movement correction in recorded magnetic resonance data.

6. The method as claimed in claim 1, further comprising choosing at least one suitable local coil as a function of the surface characteristic.

7. The method as claimed in claim 1, further comprising choosing the at least one local coil as a function of a target area of the patient to be recorded.

8. A method for positioning at least one local coil for recording magnetic resonance data with a magnetic resonance device, comprising:
measuring at least one surface data record, which describes a surface of a patient to be recorded who is already positioned for recording on a patient couch of the magnetic resonance device;
extracting the surface characteristic of the patient from the surface data record and choosing at least one of a position and a shape of at least one of the at least one local coil as a function of the surface characteristic in such a way that there is a pre-determined distance between the surface of the patient and the surface of the local coil, wherein the step of choosing the positioning and adjustment of the shape of the at least one local coil is made at least partially automatically by way of at least one movement device;
using at least one of a hydraulic and a pneumatic movement device as the at least one movement device for positioning at least one local coil; and
arranging at least one of the at least one local coils to be positioned and shaped inside the patient-receiving device of the magnetic resonance device and has two planar, flexible elements which are secured to opposing sides of the patient-receiving device and can be displaced relative to other in a shared guide, wherein the surface, dependent on the degree of overlapping, of the local coil, and therewith the at least one of position and shape of the local coil, is determined by the position of the elements relative to each other.

9. The method as claimed in claim 8, wherein the step of choosing includes securing at least one of the at least one local coil to be positioned and shaped to at least one extendable holder inside the patient-receiving device of the magnetic resonance device, choosing the extendable length of the at least one extendable holder as a function of the at least one of positioning and shape determined for the local coil.

10. The method as claimed in claim 9, further comprising leading cabling for the at least one local coil that is supported by a telescoped holder through at least one of the at least one extendable holder.

11. The method as claimed in claim 1, comprising choosing the pre-determined distance in such a way that the signal-to-noise ratio remains above a threshold value.

12. The method as claimed in claim 1, wherein at least one of the at least one local coils has distance sensors for measuring the distance from the surface of the patient, the measured values of which are used for plausibility checking of the at least one of position, shaping, automatic fine positioning, and within the context of an emergency program for spacing the local coils from the patient when they touch the patient.

13. The method as claimed in claim 1, wherein at least some of the local coils that are not required are at least one of positioned laterally on and in the patient couch.

14. The method as claimed in claim 1, further comprising using a storage space arranged at a distance from the at least one of a magnetic resonance device and a storage device for local coils arranged at a distance from the magnetic resonance device, from which the in particular automatically chosen local coils that are to be at least one of positioned and shaped are automatically conveyed to the magnetic resonance device by a conveying mechanism.

15. The method as claimed in claim 14, wherein the conveying mechanism includes a rail system, along which the local coils are conveyed.

16. The method as claimed in claim 15, wherein the rail system is also used as a storage device.

17. The method as claimed in claim 14, wherein the conveying mechanism comprises an extendable arm via which the local coils are conveyed directly to the patient couch where they are at least one of manually and automatically connected.

18. The method as claimed in claim 1, wherein on actuation of an operating element at least one movement device for positioning the local coils comprising the local coil is automatically removed from the patient.

19. A magnetic resonance system, comprising a magnetic resonance device and a local coil system having a controller designed for carrying out a method as claimed in claim 1.

* * * * *